United States Patent
Nowling et al.

(10) Patent No.: US 8,716,146 B2
(45) Date of Patent: May 6, 2014

(54) LOW TEMPERATURE ETCHING OF SILICON NITRIDE STRUCTURES USING PHOSPHORIC ACID SOLUTIONS

(75) Inventors: Gregory Nowling, Pleasanton, CA (US); John Foster, Mountain View, CA (US)

(73) Assignee: Intermolecular, Inc, San Jose, CA (US)

( * ) Notice: Subject to any disclaimer, the term of this patent is extended or adjusted under 35 U.S.C. 154(b) by 0 days.

(21) Appl. No.: 13/541,397

(22) Filed: Jul. 3, 2012

(65) Prior Publication Data

US 2014/0011367 A1 Jan. 9, 2014

(51) Int. Cl.
*H01L 21/302* (2006.01)

(52) U.S. Cl.
USPC .......... 438/757; 438/745; 438/754; 216/106

(58) Field of Classification Search
USPC ......... 438/745, 750, 755, 756, 757, 738, 754; 216/83, 106, 103, 108
See application file for complete search history.

(56) References Cited

U.S. PATENT DOCUMENTS

| | | | |
|---|---|---|---|
| 5,419,805 A | 5/1995 | Jolly | |
| 5,518,966 A | 5/1996 | Woo | |
| 6,087,273 A | 7/2000 | Torek | |
| 6,200,910 B1 | 3/2001 | O'Brien et al. | |
| 6,316,350 B1 | 11/2001 | Eissa | |
| 6,316,370 B1 | 11/2001 | Mercaldi | |
| 6,355,546 B1 | 3/2002 | Huang | |
| 6,638,326 B2 | 10/2003 | Small | |
| 7,338,910 B2 * | 3/2008 | Lee et al. | 438/745 |
| 8,105,851 B1 * | 1/2012 | Ku et al. | 438/8 |
| 8,343,867 B2 * | 1/2013 | Ng et al. | 438/630 |
| 2001/0037995 A1 | 11/2001 | Akatsu | |
| 2010/0081245 A1 * | 4/2010 | Yang et al. | 438/299 |
| 2010/0167514 A1 | 7/2010 | Kirkpatrick | |
| 2013/0029495 A1 | 1/2013 | Adhiprakasha | |
| 2013/0078809 A1 * | 3/2013 | Yu et al. | 438/689 |

OTHER PUBLICATIONS

Siliconfareast; Wet Etching Recipes; Feb. 8, 2011; SiliconFarEast; httpwww.siliconfareast.cometch_recipes.htm 2 pages.
White, R., et al.; Isotropic Silicon Etching Using HFNitricAcetic Acid HNA; Jun. 6, 2007; Tufts University; Journal of the Electrochemical Society pp. 19031909.
Lab Manual Miscellaneous Etchants; ; University of California, Berkeley; Marvell Nanofabrication Laboratory 13 pages.
Yongliang et al.; Selective wet etch of a TaN metal gate with an amorphoussilicon hard mask; Apr. 18, 2010; Z—Not Available; Unknown.
Scott Clark; Silicon Nitride etch; Jan. 1, 1998; Bold Technologies, Inc.; MSCE.

* cited by examiner

Primary Examiner — Lan Vinh

(57) ABSTRACT

Provided are methods for processing semiconductor substrates. The methods involve etching silicon nitride structures using phosphoric acid solutions maintained at low temperatures, such as between about 110° C. and 130° C. These temperatures provide adequate etching rates and do not damage surrounding metal silicide and silicon oxide structures. The etching rates of silicon nitride may be 10 Angstroms per minute and greater. Lower temperatures also allow decreasing concentrations of phosphoric acid in the etching solutions, which in some embodiments may be less than 90 weight percent. As a result, more selective etching of the silicon nitride structures may be achieved. This selectivity may be as high as hundred times relative to the silicide and silicon oxide structures. The surface conductivity of the silicide structures may remain substantially unchanged by this etching process.

20 Claims, 4 Drawing Sheets

Etching

LOW TEMPERATURE ETCHING OF SILICON NITRIDE STRUCTURES USING PHOSPHORIC ACID SOLUTIONS

BACKGROUND

Semiconductor devices have dramatically decreased in size in the last few decades. Modern devices include features that are 350 nanometers, 90 nanometers, and 65 nanometers in size and often even smaller. As device and feature sizes continue to shrink, processing methods need to be improved.

Silicon nitride films have been widely adopted by the semiconductor industry. For example, silicon nitride may be formed as temporary spacers in metal oxide semiconductor (MOS) devices, such as metal oxide semiconductor field effect transistors (MOSFETs). Specifically, silicon nitride spacers may be used during fabrication of lightly doped drain (LDD) regions to facilitate different levels of doping for the drain/source regions as well as for the LDD regions. The LDD region can be controlled by the lateral spacer dimension. Removal of silicon nitride spacers can easily damage adjacent structures, such as metal silicide layers, gates, and underlying silicon substrates.

The silicon nitride spacers are conventionally removed using a boiling or near boiling phosphoric acid solution. The concentration of phosphoric acid in the solution is kept high (e.g., above 85%) in order to achieve higher operating temperatures (e.g., 160° C. and above) and faster etching rates. Other approaches to remove silicon nitride structure involve dry etch. However, these processes often lead to erosion of metal silicides (e.g., nickel silicide) of the MOS structures.

SUMMARY

Provided are methods for processing semiconductor substrates. The methods involve etching silicon nitride structures using phosphoric acid solutions maintained at low temperatures, such as between about 110° C. and 130° C. These temperatures provide adequate etching rates and do not damage surrounding metal silicide and silicon oxide structures. The etching rates of silicon nitride may be 10 Angstroms per minute and greater. Lower temperatures also allow decreasing concentrations of phosphoric acid in the etching solutions, which in some embodiments may be less than 90 weight percent. As a result, more selective etching of the silicon nitride structures may be achieved. This selectivity may be as high as hundred times relative to the silicide and silicon oxide structures. The surface conductivity of the silicide structures may remain substantially unchanged by this etching process.

In some embodiments, a method for processing semiconductor substrates involves providing a semiconductor substrate including a first structure having metal silicide and second structure having silicon nitride. The method proceeds with exposing the semiconductor substrate to an etching solution containing phosphoric acid. The etching solution may be at a temperature of between about 110° C. and 130° C. or, more specifically, between about 115° C. and 125° C., for example at 120° C. The method proceeds with etching the second structure such that the second structure is removed by etching from the semiconductor substrate while the second structure remains substantially intact. For purpose of this document, "substantially intact" or "intact" means that overall function and structure of the component remain after processing. The component may lose some of its materials during processing; however, the amount of this material is not significant and does not impact the function of the component. In some embodiments, the etching rate of the second structure is at least about 10A/min.

In some embodiments, the concentration of phosphoric acid in the etching solution is less than 80 weight percent or, more specifically, less than 75 weight percent. The etching solution may include at least 20 weight percent of water. In some embodiments, the etching solution also includes a silicon-containing additive (e.g., silica) having a concentration of less than 1 weight percent.

In some embodiments, the method also involves a pretreatment operation performed prior to exposing the semiconductor substrate to the etching solution. The pretreatment operation may involve exposing the semiconductor substrate to a pretreatment solution including hydrofluoric acid, e.g., at a concentration of less than 5 weight percent. The pretreatment operation is performed to remove native oxides from silicon nitride structures prior to remove the silicon nitride structures.

In some embodiments, the ratio of silicon nitride to metal silicide etching rates is at least about 50 or, more specifically, at least about 100. As such, the metal silicide structures remain substantially intact even though the silicon nitride structures are etched away. For example, the surface resistance of the metal silicide before and after exposing the semiconductor substrate to the etching solution (and etching the silicon nitride structure) is less than about 5%. In some embodiments, etching of the silicon nitride structure may take 30 minutes or less to remove the structure from the substrate. This timing may be sufficient to etch silicon nitride structures that are about 300 Angstroms in size or less. In some embodiments, the second structure (i.e., the silicon nitride structure) is completely removed during the period of time from the semiconductor substrate. Alternatively, some silicon nitride residue may remain on the semiconductor substrate after etching. However, this residue may not interfere with subsequent processing of the substrate.

Etching of the silicon nitride structure generally depends on various characteristics of the structure. Some of these characteristics are determined by deposition techniques used to form the structure. In some embodiments, the second structure is formed using plasma enhanced chemical vapor deposition (PECVD) or low pressure chemical vapor deposition (LPCVD).

In some embodiments, the first structure includes one of nickel silicide and cobalt silicide. The semiconductor substrate may also include a third structure that includes silicon oxide. For example, a silicon oxide layer may be provided underneath the silicon nitride structure. The ratio of silicon nitride to silicon oxide etching rates may be at least 50.

In some embodiments, the etching solution used for exposing the semiconductor substrate and for removing the silicon nitride structures has a boiling point of less than 130° C. The concentration of phosphoric acid in the etching solution determines its boiling temperature and generally a higher concentration of phosphoric acid leads to higher temperatures. The boiling point of 130° C. corresponds to a concentration of about 63 weight percent. A lower concentration of phosphoric acid makes more water available for reaction, which favorably shifts the thermodynamic balance. For example, a concentration of about 58% weight percent has a boiling point of 110° C.

For purposes of this document, structures containing silicon nitride are referred to as silicon nitride containing structure or, interchangeably, silicon nitride structures. It should be understood that silicon nitride structures described in this document may also include materials other than silicon nitrides (i.e., in addition to silicon nitride).

These and other embodiments are described further below with reference to the figures.

DETAILED DESCRIPTION OF EXAMPLE EMBODIMENTS

Figure 1A:
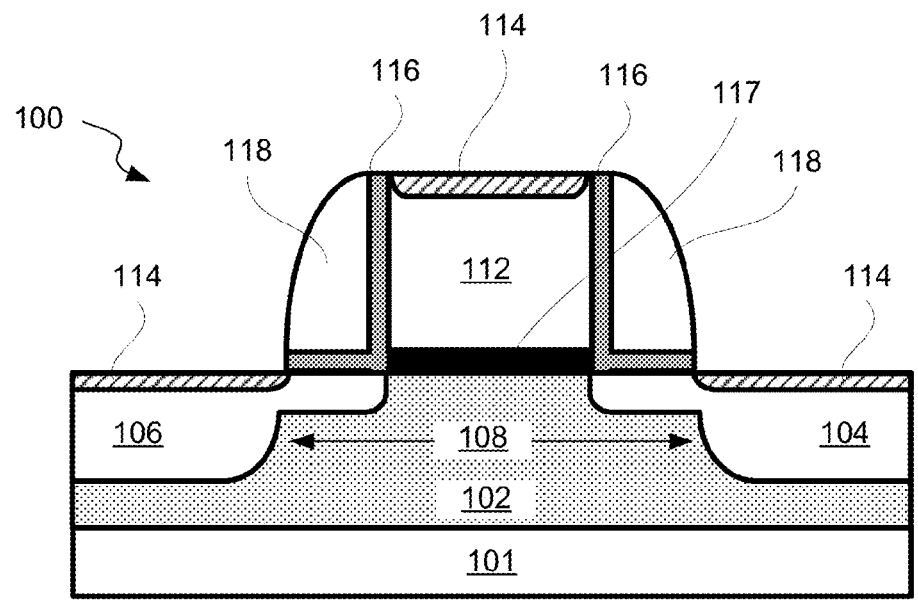
FIGS. 1A and 1B illustrate schematic representations of semiconductor substrate portions before and after etching, in accordance with some embodiments.

In the following description, numerous specific details are set forth in order to provide a thorough understanding of the presented concepts. The presented concepts may be practiced without some or all of these specific details. In other instances, well known process operations have not been described in detail so as to not unnecessarily obscure the described concepts. While some concepts will be described in conjunction with the specific embodiments, it will be understood that these embodiments are not intended to be limiting.

Introduction

Silicon nitride films or, more generally, silicon nitride structures have many applications in semiconductor devices, such as spacers in a metal-oxide semiconductor (MOS) transistor devices, oxygen diffusion barriers, mechanical protection layers, and electrical insulators with relative high dielectric constants. Often silicon nitride structures are used temporarily and need to be removed from the substrate. This removal should be performed without damaging remaining integrated circuit components, such as metal silicides and silicon oxides.

Provided are methods for processing semiconductor substrates to remove silicon nitride structures without substantial damage to adjacent silicide and oxide containing structures. Specifically, low temperature etching solutions that include phosphoric acid are used. In some embodiments, the temperature of the solution is between about 110° C. and 130° C. These temperatures provide adequate etching rates of silicon nitride structures. For example, the etching rates of 10 Angstroms per minute and greater may be achieved. Such etching rates allow removal of silicon nitride structures as large as 300 Angstroms within a reasonable processing timeframe (e.g., less than 30 minutes). It has been found that using temperatures lower than 110° C. results in unreasonably slow etching rates, while temperatures greater than 130° C. cause substantial degradation of the adjacent structures as further described below and supported by the experimental data.

Lowering the temperature of the water-based phosphoric acid solution to a certain level allows using more water in the solution thereby thermodynamically shifting the reaction into more favorable operating mode. As further described below, etching silicon nitride consumes more water molecules than phosphoric acid molecules. It has been found that addition of water (i.e., diluting solution to a certain extent) actually increases the etching rate and, more importantly, selectivity of the etching solution. The selectivity may be as high as hundred times relative to the silicide and silicon oxide structures. As such, substantially no etching or damage is experienced by surrounding silicide and silicon oxide structures while silicon nitride is being removed. For example, the surface conductivity of the silicide structures may remain substantially unchanged.

It was also found that etching rates depend on stoichiometry of silicon nitride materials, processing conditions (e.g., substrate temperatures) used during deposition of these materials, and physical characteristics (e.g., density) of resulting structures. For example, silicon nitride structures formed using plasma enhanced chemical vapor deposition (PECVD) tend to exhibit etching rates that are three times greater than structures formed using low pressure chemical vapor deposition (LPCVD). In some embodiments, silicon nitride structures may be formed using nitridation of silicon by exposing a silicon surface to nitrogen (e.g., at 1300° C.), to ammonia (e.g., at 1100-1300° C.), or to hydrazine (e.g., at 1100-1300° C.). Ammonia may be also used to convert silicon dioxide into silicon nitride. Silicon nitride structures be also used by various chemical vapor deposition (CVD) techniques, such as normal pressure CVD using silicon chloride, silicon bromides, silicon fluoride, and silane by combining these gases with ammonia or hydrazine (e.g., at 500-1100° C.). UV sensitized, platinum catalyzed, low pressure, and RF and DC "glow" variations of CVD may be used as well. Furthermore, silicon nitride structures may be deposited using reactive or direct RF sputtering, electron beam evaporation, and ion implantation.

Etching of silicon nitride in a water-based phosphoric acid solution can be represented by the following equation:

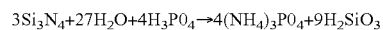

$$3Si_3N_4 + 27H_2O + 4H_3PO_4 \rightarrow 4(NH_4)_3PO_4 + 9H_2SiO_3$$

During etching, water hydrolyzes silicon nitride to form hydrous silica and ammonia, while the ammonia remains in the solution in the form of ammonium phosphate. The stoichiometry of this equation indicates that water is an integral part of the etching process. In fact, more than six molecules of water are consumed for each molecule of phosphoric acid. Yet, conventional etching solutions use 85-90 weight percent of phosphoric acid to achieve processing temperatures of above 150° C.

The temperature and composition of etching solutions have substantial impact on etch rates and selectivity during silicon nitride removal. Traditional approaches use highly concentrated solutions (e.g., 85-92 weight percent of phosphoric acid) maintained at between 150° C. and 180° C. Usually, the concentration of phosphoric acid in a solution determines the operating temperature as the solution is maintained at or near its boiling point. For example, a commercially available solution containing 85 weight percent of phosphoric acid has a boiling point of 154° C. Some water is typically removed from the solution to make it more concentrated and increase its boiling temperature (i.e., above 154° C.). A typical process control involves maintaining a desired temperature by controlling the composition of the etching solution. In other words, as water evaporates from the solution allowing it to boil at a higher temperature, more water is added to bring the boiling temperature down to the desirable level. As such, no precise control of heating is used or necessary.

It has been found that operating at such high temperatures causes degradation of surrounding components, such as metal silicides and oxides. For example, an etching rate ratio of silicon nitride to silicon oxide is only about ten for a typical 90% solution etching process. As such, substantial amounts of silicon oxide are etched while etching silicon nitride. Etching at temperatures above 150° C. has similar effects on metal silicide as evident by substantial changes to their surface resistances.

Provided methods address these issues by using etching solutions at much lower temperatures, i.e., about 110° C. and 130° C. in some embodiments. These temperatures still provide adequate etching rates of silicon nitride structures, e.g., at least about 10 Angstroms per minute, that are adequate for etching silicon nitride structures as large as 300 Angstroms within a reasonable processing timeframe. Lowering the temperature of the solution also allows using more water in the solution shifting the reaction into more favorable operating mode as described above.

Semiconductor Device Examples

Figure 1B:
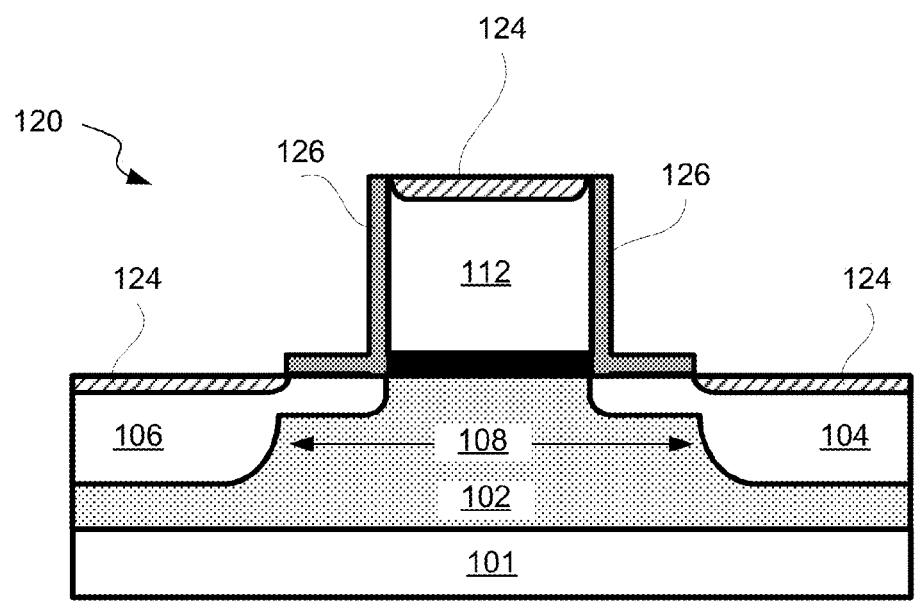

Prior to describing further details of etching processed, a brief description of semiconductor device examples is presented below to provide better understanding of various processing features. Specifically, FIGS. 1A and 1B illustrate schematic representations of substrate portions including MOS device 100 before etching and the same device 120 after etching, in accordance with some embodiments. The references below are made to PMOS devices but other types of devices can be used and will be understood by one having ordinary skill in the art. PMOS device 100 may include a p-doped substrate 101 and an n-doped well 102 within substrate 101. Substrate 101 is typically a part of an overall wafer substrate together with other transistors and devices. P-doped substrate 101 may include any suitable p-type dopants, such as boron and indium, and may be formed by any suitable technique. N-doped well 102 may include any suitable n-type dopants, such as phosphorus and arsenic, and may be formed by any suitable technique. N-doped well 102 may be formed by doping substrate 101 by ion implantation, for example.

Device 100 also includes a conductive gate electrode 112 that is separated from n-doped well 102 by gate dielectric 117. Gate 112 may include any suitable material. In one embodiment, gate 112 may comprise polysilicon. In another embodiment, gate 112 may include polysilicon doped with a p-type dopant, such as boron. Typically, gate dielectric 117 is deposited in the form of silicone dioxide, but other gate dielectric materials can be also selected, such as hafnium silicon oxide, lanthanum oxide, zirconium oxide, zirconium silicon oxide, tantalum oxide, titanium oxide, barium strontium titanium oxide, barium titanium oxide, strontium titanium oxide, yttrium oxide aluminum oxide, lead scandium tantalum oxide, or lead zinc niobate.

Device 100 also includes p-doped source region 104 and drain region 106 (or simply the source and drain) in n-doped well 102. Source 104 and drain 106 are located on each side of gate 112 forming channel 108 within well 102. Source 104 and drain 106 may include a p-type dopant, such as boron. Additionally, source 104 and drain 106 may be formed in recesses of n-doped well 102.

Device 100 is also shown having sidewall spacers 118 along the sidewalls of gate 112. Spacers 118 may include any suitable dielectric materials, such as silicon nitride or silicon oxide. In some embodiments, spacers 118 are between about 200 Angstroms and 400 Angstroms in size, e.g., about 300 Angstroms. It should be noted that spacers 118 may be removed during etching and, therefore, are not shown in FIG. 1B.

In some embodiment, source 104 and drain 106 and gate 112 are covered with a layer of self-aligned silicide portions 114, which may be also referred to as salicide portions or simply salicides. For example, a layer of cobalt is deposited as a blanket and thermally treated to form these portions 114. Alternatively, nickel or other refractory metals, such as tungsten, titanium, and palladium, and are suitable for forming silicide portions 114.

A sequence of forming some of these components will now be described. Usually, sidewall spacers 118 are formed after forming gate 112. Liner 116 made from, for example, silicon dioxide may be interposed between spacers 118 and gate 112. Liner 116 may be L shaped and have a thickness of about 30-120 Angstroms. Liner 116 may further include an offset spacer (not shown).

Source 104 and drain 106 are formed after formation of sidewall spacers 118 using, for example, ion implantation. After the source and drain formation, the overall substrate may be subjected to an annealing and/or activation thermal process. The process may continue with forming silicide portion 114 by self-aligned silicide (salicide) technique. The blanket metal film may be subjected to rapid thermal process (RTP) to react the metal layer with the silicon contained within the gate structure and the source/drain region to form a metal silicide. The temperature for RTP may be in the range of 700° C. to 1000° C.

Spacers 118 are then etched away leaving liner 116 exposed as shown in FIG. 1B. It is desirable to keep liner 116 remaining on the sidewalls of gate 112 and silicide portions 114 substantially intact. As further described below with reference to FIG. 2, spacer 118 may be removed by a wet etching process that does not damage liner 116 or silicide portions 114.

Processing Examples

Figure 2:
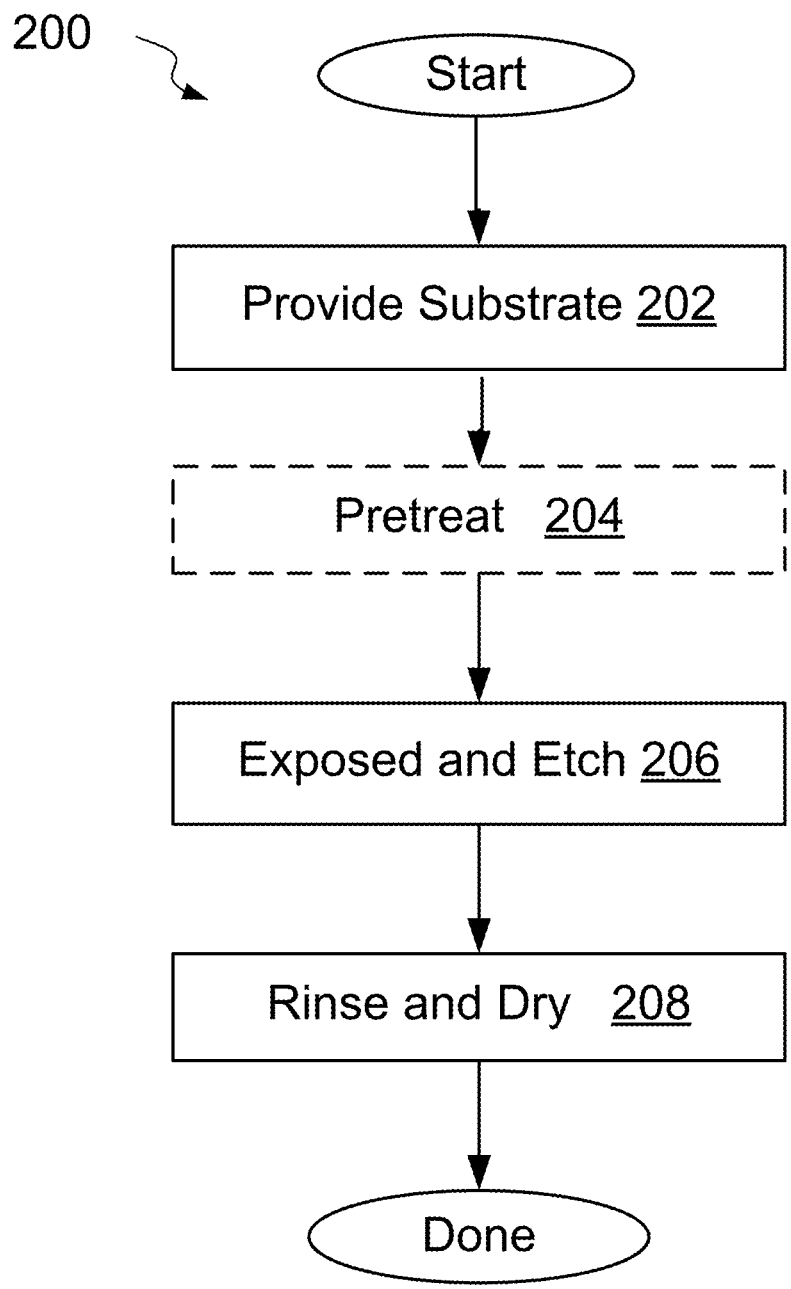
FIG. 2 illustrates a process flowchart corresponding to a method of processing a semiconductor substrate to remove silicon nitride structures from the surface of the substrate using a phosphoric acid solution, in accordance with some embodiments.

FIG. 2 illustrates a process flowchart corresponding to method 200 of processing a semiconductor substrate to remove silicon nitride containing structures from the surface of the substrate, in accordance with some embodiments. Method 200 may commence with operation 202, during which a semiconductor substrate including one or more metal silicide structures and silicon nitride structures is provided. Some substrate examples are described above with reference to FIGS. 1A and 1B.

Method 200 may proceed with an optional pretreatment operation 204. This operation may involve exposing the semiconductor substrate or at least its silicon nitride structure to a pretreatment solution to remove native oxides form surfaces of these structures. In some embodiments, the pretreatment solution includes hydrofluoric acid at a concentration of less than 5 weight percent. The pretreatment solution may be maintained at a room temperature. The exposure to the pretreatment solution may last between about 10 seconds and 5 minutes, for example, about 1 minute. Excessive hydrofluoric acid concentrations, duration, and temperature should be avoided to prevent damage to other components of the device, such as a liner made from silicon oxide. After completing operation 204, the substrate may be rinsed to remove residual cleaning solution. Operation 206 may be started relatively soon to prevent formation of a new native oxide after completion of operations 204.

Figure 3:
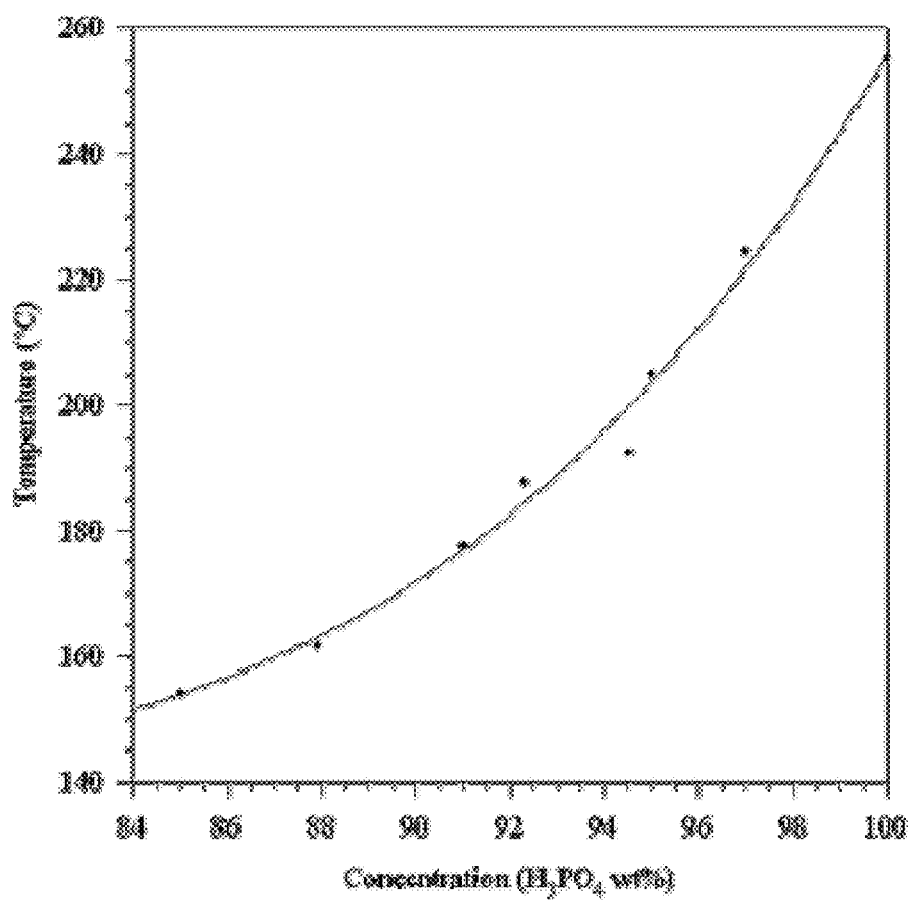
FIG. 3 illustrates a plot of a boiling temperate as a function of the phosphoric acid concentration in the etching solution, in accordance with some embodiments.

Method 200 may proceed with exposing the semiconductor substrate to an etching solution and etching the silicon nitride structure during operation 206. The etching solution may include phosphoric acid at a concentration of less than about 80 weight percent or, more specifically, at a concentration of less than about 75 weight percent. In some embodiments, the concentration is specifically adjusted to the particular operating temperature. As such, when etching is performed at 130° C., the etching solution needs to have at least about 63 weight percent of phosphoric acid. When etching is performed at 110° C., the etching solution needs to have at least about 58 weight percent of phosphoric acid. FIG. 3 illustrates a plot of a boiling temperate as a function of the phosphoric acid concentration in the etching solution, in accordance with some embodiments.

Lower concentrations of phosphoric acid are not possible since the operating temperature may not exceed the boiling point of the solution. Higher concentrations of phosphoric acid are possible such that etching is performed at temperatures lower the boiling point. In some embodiments, etching is performed at a temperature that is at least about 10° C. lower than the boiling point of the etching solution or, more specifically, at least about 20° C. lower. Greater temperature differences require more concentrated etching solutions, which may be less thermodynamically favorable because of lower water content as described above. In some embodiments, the etchant has at least about 20 weight percent of water or, more specifically, at least about 30 percent.

In some embodiments, the etching solution includes some silicon, which may be in a form of a silicon-containing additive, such as silica. The concentration of silicon-containing additives may be less than about 1 weight percent or, more specifically, less than about 0.5 weight percent. Silicon may be also introduced into the etching solution by seasoning the etching solution using silicon nitride structures. For example, dummy silicon nitride structures may be placed into a fresh etching solution containing phosphoric acid and water to introduce some etching products into the solution and slightly shifting the thermodynamic balance.

In some embodiments, the etching solution is maintained at a temperature of between about 110° C. and 130° C. or, more specifically at between about 115° C. and 125° C., such as at about 120° C. These temperatures provide adequate etching rates of silicon nitride structures and allow etching silicon nitride structures as large as 300 Angstroms within a reasonable processing timeframe.

The silicon nitride structure is removed from the substrate by maintaining the substrate in the etching solution for predetermined period of time. This time is usually driven by the size of the silicon nitride structure and etching rate. In some embodiments, the etching rate is at least about 10 Angstroms per minute or, more specifically, at least about 20 Angstroms per minute. As stated above, the etching rate depends on temperature and composition of the etching solution, which are listed above. In some embodiments, the duration of etching operation 206 is less than about 30 minutes or, more specifically, less than about 20 minutes. In some embodiments, the silicon nitride structure is completely removed from the substrate. In other embodiments, some silicon nitride residue retains on the substrate.

Etching operation 206 may be result in complete or near complete removal of the silicon nitride structures. However, other structures provided on the same substrate and exposed to the etching solution may remain substantially intact. The relative impacts of the etching solution on different structures may be expressed with etching rate ratios. In some embodiments, a ratio of the silicon nitride to metal silicide etching rates is at least about 50 or, more specifically, at least about 100. That means that removal of a 300 Angstrom silicon nitride structure will correspond to less than about 6 Angstroms (or less than about 3 Angstroms) of metal silicide removal. In some embodiments, a ratio of the silicon nitride to silicon oxide etching rated is at least about 50 or, more specifically, at least about 100.

Another way of expressing impact of etching operation 206 on other components (i.e., other than silicon nitride components) is based on changes to the properties. In some embodiments, a change in a surface resistance of the metal silicide before and after exposing the semiconductor substrate to the etching solution is less than about 5% or, more specifically, less than about 3%.

After completion of operation 206, method 200 may proceed with rinsing and drying the substrate during operation 208. The residual etching solution is removed from the substrate surface during this operation by, for example, rinsing the surface with deionized water and drying with an inert gas, such as nitrogen or argon.

Apparatus Examples

Figure 4:
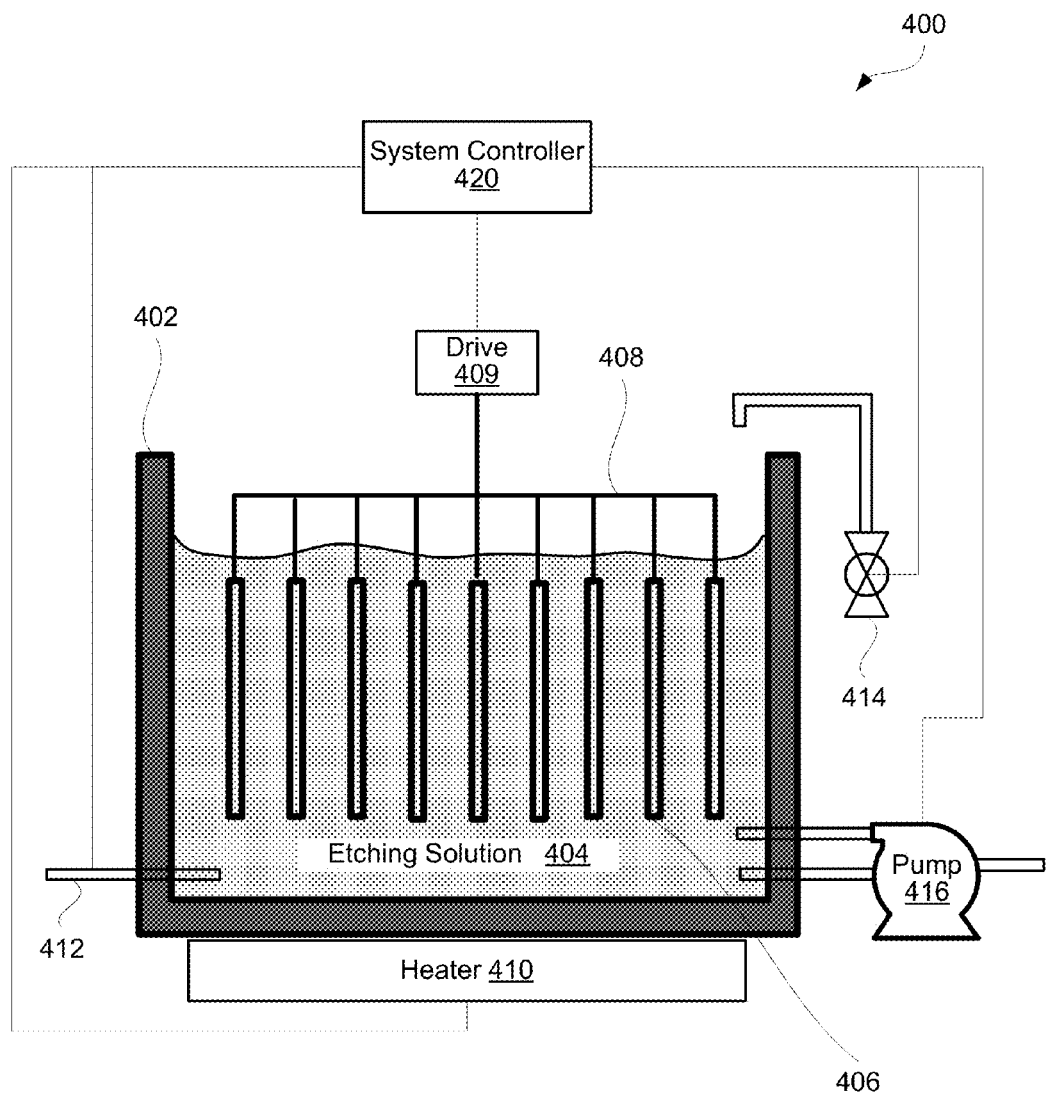
FIG. 4 illustrates a schematic representation of an etching apparatus for processing a semiconductor substrate to remove silicon nitride structures from the surface of the substrate, in accordance with some embodiments.

FIG. 4 illustrates a schematic representation of etching apparatus 400 for processing a semiconductor substrate to remove one or more silicon nitride containing structures from the surface of the substrate, in accordance with some embodiments. For clarity, some components of apparatus 400 are not included in this figure. Apparatus 400 includes bath 402 for containing etching solution 404. One or more semiconductor substrates 406 may be submerged into etching solution 404 for processing or, more specifically, for removal of silicon nitride structures. Substrate 406 may be supported by substrate holder 408, which may be attached to drive 409 for moving substrate holder 408. Specifically, substrate holder 408 may be moved to submerge substrates 406 into etching solution 404 for processing, remove substrates 406 from etching solution 404 after processing, and/or to move substrates 406 within etching solution 404 during processing (e.g., to agitate etching solution 404).

Apparatus 400 also includes heater 410 and temperature sensor 412 (e.g., a thermocouple) for maintaining etching solution 404 at a predetermined temperature. As described above, etching solution 404 may be maintained at a temperature that is lower than its boiling temperature and precise temperature control may be needed. Heater 410 and temperature sensor 412 may be connected to system controller 420, which may control power supplied to heater 410 based on signals received from temperature sensor 412. Various features of system controller 420 are described below.

Apparatus 400 may also include a liquid delivery system 414 for supplying additional liquids and controlling the composition of etching solution 404. For example, some water and/or phosphoric acid may evaporate from bath 402 and additional water and/or phosphoric acid may be added into bath 402 by liquid delivery system 414. Liquid delivery system 414 may be connected to and controlled by system controller 420. Various sensors (e.g., conductivity sensor, weight sensor) may be used to provide signal about potential changes in composition of etching solution 404. Apparatus 400 may be also equipped with pump 416 for recirculating etching solution 404 in bath 402 and other purposes. Pump 416 may be also connected to and controlled by system controller 420.

Apparatus 400 may include system controller 420 for controlling process conditions during silicon nitride etching processes. Controller 420 may include one or more memory devices and one or more processors with a CPU or computer, analog and/or digital input/output connections, stepper motor controller boards, etc. In some embodiments, controller 420 executes system control software including sets of instructions for controlling timing of operations, temperature of etching solution 404, composition of etching solution 404, and other parameters. Other computer programs and instruction stored on memory devices associated with controller may be employed in some embodiments.

In some embodiments (not shown), bath 402 may be closed such that etching solution 404 may be pressured inside bath 402 to increase its boiling point. For example, bath 402 may be operated at a pressure of at least about 5 psi or, more specifically, at a pressure of at least about 25 psi, e.g., at about 50 psi. This bath pressurization would allow increasing etching rates of silicon nitride (by increasing the temperature) without negatively impacting selectivity since the composition of the etching solution is not changed.

Experimental Results

A series of experiments were conducted to determine impact of temperature and etching solution composition on removal of silicon nitride, silicon oxide, and nickel silicide. These materials were provided as films on a substrate heated to different controlled temperatures. Etching solutions having different compositions were dropped on the surfaces of these films and etching rates (for silicon nitride and silicon oxide) and changes in surface resistance (for nickel silicide) were measured thereafter.

During the experiment, all samples were heated to 120° C. and two etching solutions have been used. The first solution had 85 weight percent of phosphoric acid in water, while the second solution was the first solution diluted in half (i.e., 50 weight percent of the first solution and 50 weight percent of water). The etching was performed for 120 seconds. The first solution caused a silicon nitride etching rate of 8.4 Angstroms per minute, while the second solution caused an etching rate of 10.4 Angstroms per minute. Both solutions showed comparable silicon oxide etching of less than 0.15 Angstroms per minute resulting in the selectivity rates of more than 50 for the first solution and more than 70 for the second solution. Changes in surface conductivities of the metal silicides were negligible for both solutions.

CONCLUSION

Although the foregoing concepts have been described in some detail for purposes of clarity of understanding, it will be apparent that some changes and modifications may be practiced within the scope of the appended claims. It should be noted that there are many alternative ways of implementing the processes, systems, and apparatuses. Accordingly, the present embodiments are to be considered as illustrative and not restrictive.

What is claimed is:

1. A method for processing semiconductor substrates, the method comprising:
   providing a semiconductor substrate comprising a first structure and a second structure,
      the first structure comprising metal silicide,
      the second structure comprising silicon nitride;
   exposing the semiconductor substrate to an etching solution comprising phosphoric acid at a temperature of between 110° C. and 130° C.; and
   etching the second structure with the etching solution,
      wherein the first structure is exposed to the etching solution for at least some time during etching of the second structure, and
      wherein a ratio of an etching rate of the silicon nitride to an etching rate of the metal silicide is at least 50.

2. The method of claim 1, wherein an etching rate of the second structure is at least 10 Angstroms per minute.

3. The method of claim 1, wherein the etching solution is at a temperature of between 115° C. and 125° C.

4. The method of claim 1, wherein the etching solution is at a temperature of 120° C.

5. The method of claim 1, wherein a concentration of phosphoric acid in the etching solution is less than 80 weight percent.

6. The method of claim 1, wherein a concentration of phosphoric acid in the etching solution is less than 75 weight percent.

7. The method of claim 1, wherein the etching solution comprises at least 20 weight percent of water.

8. The method of claim 1, wherein the etching solution comprises a silicon-containing additive having a concentration of less than 1 weight percent.

9. The method of claim 1, further comprising, prior to exposing the semiconductor substrate to the etching solution, exposing the semiconductor substrate to a pretreatment solution comprising a hydrofluoric acid at a concentration of less than 5 weight percent.

10. The method of claim 1, wherein the metal silicide comprises one of nickel silicide and cobalt silicide.

11. The method of claim 1, wherein a ratio of an etching rate of the silicon nitride to an etching rate of the metal silicide is at least 100.

12. The method of claim 1, wherein a surface resistance of the metal silicide changes by less than 5% before and after exposing the semiconductor substrate to the etching solution and etching the second structure.

13. The method of claim 1, wherein the etching of the second structure is performed for 30 minutes or less.

14. The method of claim 1, wherein the second structure is completely removed from the semiconductor substrate.

15. The method of claim 1, wherein the second structure is formed by depositing silicon nitride using plasma enhanced chemical vapor deposition (PECVD).

16. The method of claim 1, wherein the second structure is formed by depositing silicon nitride using low pressure chemical vapor deposition (LPCVD).

17. The method of claim 1, wherein the semiconductor substrate further comprises a third structure comprising silicon oxide, and wherein a ratio of an etching rate of the silicon nitride to an etching rate of the silicon oxide is at least 50.

18. The method of claim 1, wherein a concentration of phosphoric acid in the etching solution is between 58 weight % and 80 weight %.

19. A method for processing semiconductor substrates, the method comprising:
   providing a semiconductor substrate comprising a first structure, a second structure, and a third structure,
      the first structure comprising nickel silicide,
      the second structure comprising silicon nitride, and
      the third structure comprising silicon oxide,
         wherein the first structure, the second structure, and the third structure form a portion of a metal oxide semiconductor (MOS) transistor device;
   exposing the semiconductor substrate to an etching solution,
      the etching solution comprising phosphoric acid and water and having a boiling point of less than 130° C.; and
   etching the second structure in the etching solution,
      wherein the second structure is removed from the semiconductor substrate;
      wherein the first structure is exposed to the etching solution for at least some time during etching of the second structure, and
      wherein a ratio of an etching rate of the silicon nitride to an etching rate of the metal silicide is at least 50.

20. A method for processing semiconductor substrates, the method comprising:
   providing a semiconductor substrate comprising a first structure and a second structure,
      the first structure comprising metal silicide and the second structure comprising silicon nitride;
   exposing the semiconductor substrate to an etching solution comprising phosphoric acid; and etching the second structure,
- wherein the second structure is removed from the semiconductor substrate,
- wherein the first structure is exposed to the etching solution for at least some time during etching of the second structure, and
- wherein a ratio of an etching rate of the silicon nitride to an etching rate of the metal silicide is at least 50.

\* \* \* \* \*